(12) United States Patent
Habitz et al.

(10) Patent No.: US 8,855,993 B2
(45) Date of Patent: Oct. 7, 2014

(54) INTEGRATED CIRCUIT DESIGN SIMULATION MATRIX INTERPOLATION

(75) Inventors: Peter A. Habitz, Hinesburg, VT (US); Amol A. Joshi, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 13/251,517

(22) Filed: Oct. 3, 2011

(65) Prior Publication Data

US 2013/0085726 A1 Apr. 4, 2013

(51) Int. Cl.
*G06F 17/50* (2006.01)

(52) U.S. Cl.
CPC .................................. *G06F 17/5036* (2013.01)
USPC ................................................. 703/14; 703/2

(58) Field of Classification Search
CPC . G06F 17/50; G06F 17/5009; G06F 17/5022; G06F 17/5031; G06F 17/5036; G06F 17/5045; G06F 2217/78
USPC ...................................................... 703/13, 14
See application file for complete search history.

(56) References Cited

U.S. PATENT DOCUMENTS

| | | | |
|---|---|---|---|
| 5,369,594 A | 11/1994 | Huang et al. | |
| 5,655,109 A | 8/1997 | Hamid | |
| 5,774,382 A * | 6/1998 | Tyler et al. | 703/2 |
| 6,289,490 B1 | 9/2001 | Boyd et al. | |
| 6,615,164 B1 | 9/2003 | Gopisetty et al. | |
| 6,807,520 B1 | 10/2004 | Zhou et al. | |
| 6,820,046 B1 | 11/2004 | Lamson et al. | |
| 7,024,652 B1 | 4/2006 | McGaughy et al. | |
| 7,346,872 B2 | 3/2008 | Yalcin et al. | |
| 7,774,725 B1 | 8/2010 | Jain et al. | |
| 2003/0204817 A1* | 10/2003 | Kashyap | 716/1 |
| 2003/0212972 A1* | 11/2003 | Tran | 716/6 |
| 2006/0015302 A1* | 1/2006 | Fang | 703/2 |
| 2006/0048081 A1 | 3/2006 | Kiel et al. | |
| 2007/0276896 A1 | 11/2007 | Kalafala et al. | |
| 2008/0133202 A1* | 6/2008 | Tseng et al. | 703/14 |
| 2009/0217226 A1 | 8/2009 | Cui et al. | |
| 2009/0241076 A1 | 9/2009 | Emek | |

OTHER PUBLICATIONS

"Tolerance" definition, retrieved Aug. 8, 2013 at: http://encyclopedia2.thefreedictionary.com/Tolerance, McGraw-Hill Dictionary of Scientific & Technical Terms, 6E, © 2003.*

(Continued)

*Primary Examiner* — Kamini S Shah
*Assistant Examiner* — Michael P Healey
(74) *Attorney, Agent, or Firm* — Gibb & Riley, LLC

(57) ABSTRACT

Methods and systems perform a simulation on an integrated circuit design by applying a first value to a first variable and a second value to a second variable of the simulation to produce a first matrix corner simulation value. The methods and systems repeat the simulation using different values for the first and said second variables to produce a second matrix corner simulation value, a third matrix corner simulation value, and a fourth matrix corner simulation value. The methods and systems create a matrix, and the matrix has the first matrix corner simulation value, the second matrix corner simulation value, the third matrix corner simulation value, and the fourth matrix corner simulation value. The methods and systems interpolate all remaining values within the matrix based upon existing simulation values within the matrix.

19 Claims, 12 Drawing Sheets

(56) References Cited

OTHER PUBLICATIONS

"SiliconSmart ACE," Magma Design Automation, http://www.magma-da.com/products-solutions/libraryCharacterization/siliconsmartace.aspx, 8 pages, 2010.

"Encounter Library Characterizer," Cadence Design Systems, http://www.cadence.com/products/di/library_characterizer/pages/default, 6 pages, 2011.

* cited by examiner

INTEGRATED CIRCUIT DESIGN SIMULATION MATRIX INTERPOLATION

BACKGROUND

The present disclosure relates to integrated circuit design simulation, and more specifically, to methodologies that reduce the number of simulations that are performed by interpolating values between simulations utilized to create a matrix.

Prior to actually constructing integrated circuits, an integrated circuit design is simulated using a simulator (or software running on a computerized device) in order to determine whether there will be any problems with the integrated circuit design before the integrated circuit is actually manufactured. Further, in order to increase efficiency, previous designs can be maintained within design libraries.

SUMMARY

Exemplary method embodiments herein perform a simulation on an integrated circuit design by applying a first value to a first variable and a second value to a second variable of the simulation to produce a first matrix corner simulation value. The methods repeat the simulation using different values for the first and said second variables to produce a second matrix corner simulation value, a third matrix corner simulation value, and a fourth matrix corner simulation value. The methods create a matrix, and the matrix has the first matrix corner simulation value, the second matrix corner simulation value, the third matrix corner simulation value, and the fourth matrix corner simulation value. The methods interpolate all remaining values within the matrix based upon existing simulation values within the matrix.

An additional exemplary method herein method performs a simulation on an integrated circuit design by applying a first value to a first variable and a second value to a second variable of the simulation to produce a first matrix corner simulation value. The method repeats the simulation M times by keeping the first variable constant at the first value and by changing the second variable in each successive simulation. The Mth simulation produces a second matrix corner simulation value. The method also repeats the simulation N times by keeping the second variable constant at the second value and by changing the first variable in each successive simulation. The Nth simulation produces a third matrix corner simulation value. The method again repeats the simulation using a Nth value of the first variable and a Mth value of the second variable to produce a fourth matrix corner simulation value. The method then creates a matrix. The matrix has a first side running from the first matrix corner simulation value to the second matrix corner simulation value, a second side running from the first matrix corner simulation value to the third matrix corner simulation value, a third side running from the third matrix corner simulation value to the fourth matrix corner simulation value, and a fourth side running from the second matrix corner simulation value to the fourth matrix corner simulation value. The method then interpolates all remaining values within the matrix based upon existing simulation values within the matrix.

Further, this exemplary method can determine if the interpolated values are within a predetermined range. If the interpolated values are outside the predetermined range, the method repeats the simulation for selected interior matrix values (less than all interior matrix values) using values between the first value and the Nth value for the first variable and using values between the second value and the Mth value for the second variable until the interpolated values are within the predetermined range. The simulation for selected interior matrix values can, for example, only produce simulation values along a diagonal line between the first matrix corner simulation value and the fourth matrix corner simulation value.

A non-transitory computer readable storage medium embodiment herein is readable by a computerized device. The non-transitory computer readable storage medium stores instructions executable by the computerized device to perform a method. The method performs a simulation on an integrated circuit design by applying a first value to a first variable and a second value to a second variable of the simulation to produce a first matrix corner simulation value. The method repeats the simulation using different values for the first and said second variables to produce a second matrix corner simulation value, a third matrix corner simulation value, and a fourth matrix corner simulation value. The method creates a matrix, and the matrix has the first matrix corner simulation value, the second matrix corner simulation value, the third matrix corner simulation value, and the fourth matrix corner simulation value. The method interpolates all remaining values within the matrix based upon existing simulation values within the matrix.

BRIEF DESCRIPTION OF THE DRAWINGS

The embodiments herein will be better understood from the following detailed description with reference to the drawings, which are not necessarily drawing to scale and in which.

DETAILED DESCRIPTION

Figure 1:
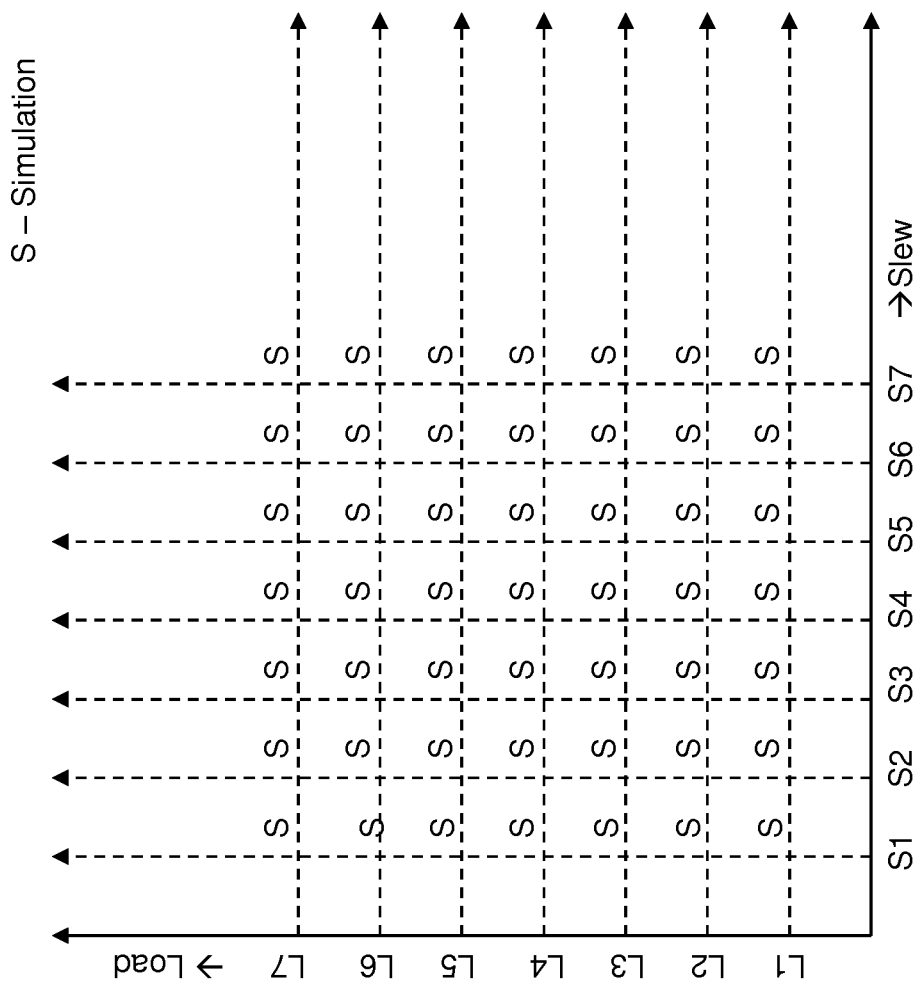
FIG. 1 is a matrix illustrating various embodiments herein.

The performance characteristics of integrated circuit designs under different operating conditions can be maintained as a matrix within design libraries. The library characterization is a process of creating abstract models of a circuit used for chip design that can use a matrix to accurately describe the circuit behavior and various electrical characteristics at various conditions during full chip analysis. It is useful to produce superior quality models in the shortest possible time, because a fast characterization turn-around-time (TAT) can impact the time-to-market for a new design. Further, quality checks can help to identify circuit design exposures early on in the process.

However, one issue with current simulations is the time it takes to perform library characterization. For example, library characterization can take several days just to characterize one process-voltage-temperature (PVT) analysis (one application specific integrated circuit (ASIC) standard cell library for one PVT analysis needs about 30,000 simulations or about 2+ days). In addition, the number of PVTs to be characterized shall increase for future technologies and statistical characterization will need more simulations than ever. Further, issues such as negative slews may trigger re-characterization and/or the need to address circuit design flaws.

Library characterization is a process of creating abstract models of a circuit used for chip design that can use a matrix to accurately describe the circuit behavior and various electrical characteristics at various conditions during full chip analysis, and it is useful to produce superior quality models in the shortest possible time. In order to address these issues, the methods disclosed herein reduce the number of simulations that are performed by interpolating values between simulations utilized to create a matrix. Thus, the methods presented herein help address library characterization TAT and quality checks. These methods optimize the number of simulations by performing necessary simulation and using interpolation technique(s) where possible. This identifies issues such as negative slews at much faster pace.

More specifically, this disclosure presents methods for providing a circuit characterization model that simulate the first column and row splines of the matrix representing parameters for the circuit to be characterized as well as the N and M corner for the matrix. Then, through a computation, these methods interpolate the other members of the matrix. These methods can also check to see if the other members of the matrix are within simulation requirements. If the other members are not within the requirements, the methods can perform additional simulations. Because the interpolation process is substantially quicker and less resource intensive than simulation, performing interpolation on some of the matrix nodes provides significant time and performance improvements compared to matrices for which each and every node is simulated.

The following examples shown in Figures and 1-4 utilized two exemplary input variables (slew and load) that are changed as the simulations are repeated to allow a matrix to be completed. For example, delays are calculated by stimulating a circuit over a range of input slew and output load (typically this is a 7×7 or 8×8 matrix). However, those ordinarily skilled in the art would understand that any other variables (process, voltage, temperature, etc.) could be used in place of slew and load and that any size matrix could be utilized. In order to demonstrate the flexibility of the embodiments herein, the input slew and output load are sometimes referred to simply as "first" and "second" variables (and such terms could equally represent process, voltage, temperature, etc.).

Therefore, FIG. 1 illustrates a matrix where all values within the matrix are calculated individually in separate simulations. More specifically, to characterize this matrix simulations were performed for every combination of input slew and output load (49 to 64 simulations). Therefore, FIGS. 1 (and 2-3) indicates a simulation with the "S" symbol at the nodes of the matrix, which are intersections of each load variable (L1-L7) and slew variable (S1-S7) that form the rows and columns of the matrix.

Figure 2:
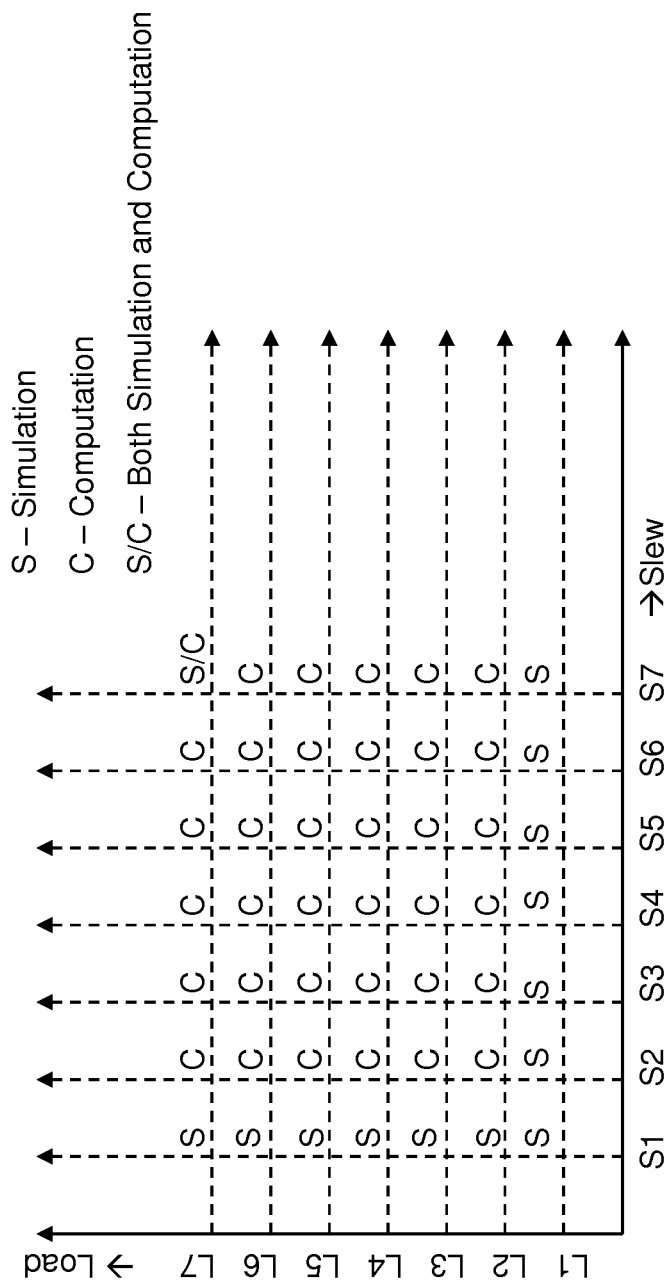
FIG. 2 is a matrix illustrating various embodiments herein.

In order to reduce the number of simulations (and decrease the time needed to create the matrix) the method shown in FIG. 2 simulates the "corners" of the matrix (and two sides of the matrix) and interpolates (calculates) the values between such simulated values. More specifically, this method first performs a simulation by applying a first value (e.g., S1) to a first variable (e.g., slew) and a second value (e.g., L1) to a second variable (e.g., load) of the simulation to produce a first matrix corner simulation value (represented as an "S" at matrix location L1, S1 in FIG. 2).

In order to form one of the sides of the matrix, the method repeats the simulation M times (L2-L7) by keeping the first variable (slew) constant at the first value (S1) and by changing the value of the second variable (from L2-L7) in each successive simulation. Each successive simulation can use equal incremental increasing changes of the second value (load). The Mth simulation produces a second matrix corner simulation value (matrix location L7, S1). All such values are again represented using "S" in FIG. 2 to denote simulated values.

The method also repeats the simulation N times (S2-S7) by keeping the second variable (load) constant at the second value (L1) and by changing the first variable (from S2-S7) in each successive simulation. Again, each successive simulation can use equal incremental increasing changes of the first value (slew). The Nth simulation produces a third matrix corner simulation value (matrix location L1, S7).

In order to determine the last corner of the matrix, the method again repeats the simulation using a Nth value (S7) of the first variable and a Mth value (L7) of the second variable to produce a fourth matrix corner simulation value (matrix location L7, S7).

With the values, the method can then begin to create the matrix without performing additional simulations. The matrix has a first side running from the first matrix corner simulation value (matrix location L1, S1) to the second matrix corner simulation value (matrix location L7, S1), a second side running from the first matrix corner simulation value (matrix location L1, S1) to the third matrix corner simulation value (matrix location L1, S7), a third side running from the third matrix corner simulation value (matrix location L1, S7) to the fourth matrix corner simulation value (matrix location L7, S7), and a fourth side running from the second matrix corner simulation value (matrix location L7, S1) to the fourth matrix corner simulation value (matrix location L7, S7).

The method then interpolates (calculates) all remaining values within the matrix based upon existing simulation values within the matrix without performing additional simulations. Because such interpolated values are calculated values, they are shown as "C" in FIGS. 2-5. Such interpolated values (C) are found from matrix locations L2, S2 to L6, S6 (and also make up portions of row L7 and column S7). Any form of interpolation that constructs new data points within the range of a discrete set of known data points can be used including spline interpolation, linear interpolation, piecewise constant interpolation, interpolation via Gaussian processes, and other forms of interpolation.

Specifically, the interpolating process comprises interpolating third side matrix values along the third side of the matrix by interpolating between the third matrix corner simulation value (matrix location L1, S7) and the fourth matrix corner simulation value (matrix location L7, S7). Further, the interpolating process interpolates fourth side matrix values along the fourth side of the matrix by interpolating between the second matrix corner simulation value (matrix location L7, S1) and the fourth matrix corner simulation value (matrix location L7, S7).

Then, the interpolating process can interpolate interior matrix values along columns (S2-S6) between the second side and the fourth side by interpolating between corresponding ones of the second side matrix values and the fourth side matrix values.

In addition, the interpolating process can also interpolate duplicate values along rows (L2-L6) between the first side and the third side by interpolating between corresponding ones of the first side matrix values and the third side matrix values. Then, in one example, the interpolating process can combine the interior matrix values and the duplicate values to produce the interpolated values (by averaging the interior matrix values and the duplicate values, or using any other method to combine the values).

Further, in the FIGS. 2-5, the symbol "S/C" is used to represent nodes of the matrix where both a simulation and a calculation is performed. If the values produced by the simulation and calculation at the same node are within a predetermined percentage (e.g., 2%, 5%, 10%, 20%, etc., or other measure) of each other, the other pure calculations (involving no simulation) within the matrix are presumed to be acceptable. If not, more simulations are performed until the values produced by the simulation and calculation at the same node are within an acceptable percentage of each other.

Figure 3:
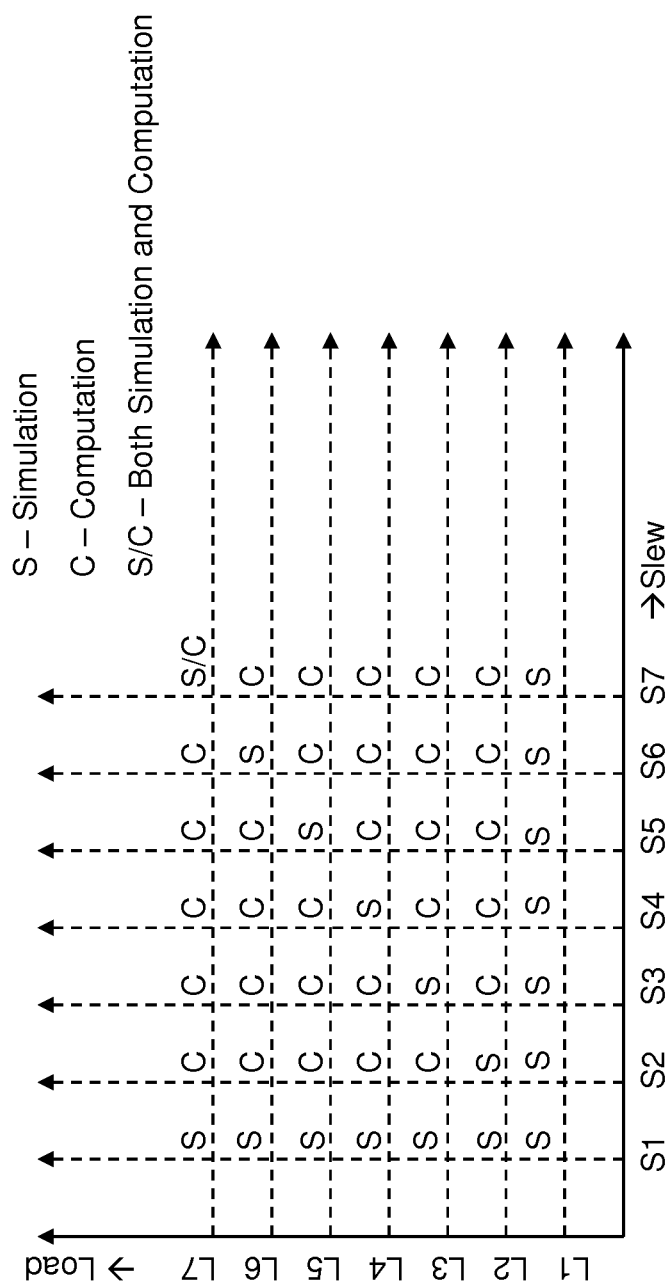
FIG. 3 is a matrix illustrating various embodiments herein.

Thus, if the values produced by the simulation and calculation at the same node are not within an acceptable percentage of each other, the method repeats the simulation for selected interior matrix nodes (which is less than all interior matrix nodes) using values between the first value (S1) and the Nth value (S7) for the first variable (slew) and using values between the second value (L1) and the Mth value (L7) for the second variable (load) until the interpolated values are within the predetermined range. For example, as shown in FIG. 3, simulations can be performed for matrix locations L2, S2; L3, S3; L4, S4; L5, S5 as shown using the indicator "S."

Thus as shown in FIG. 3, such additional simulation for selected interior matrix values can, for example, produce additional simulation values along a diagonal line between the first matrix corner simulation value (L1, S1) and the fourth matrix corner simulation value (L7, S7) leaving the remaining values of the matrix as pure calculations (interpolations). Then, the calculated values of the matrix are interpolated again (using the new simulation values) and the values produced by the simulation and calculation at the same node are checked again to see if they are within an acceptable percentage of each other. More nodes are simulated and the above processes are repeated until the values produced by the simulation and calculation at the same node are within an acceptable percentage of each other.

Figure 4:
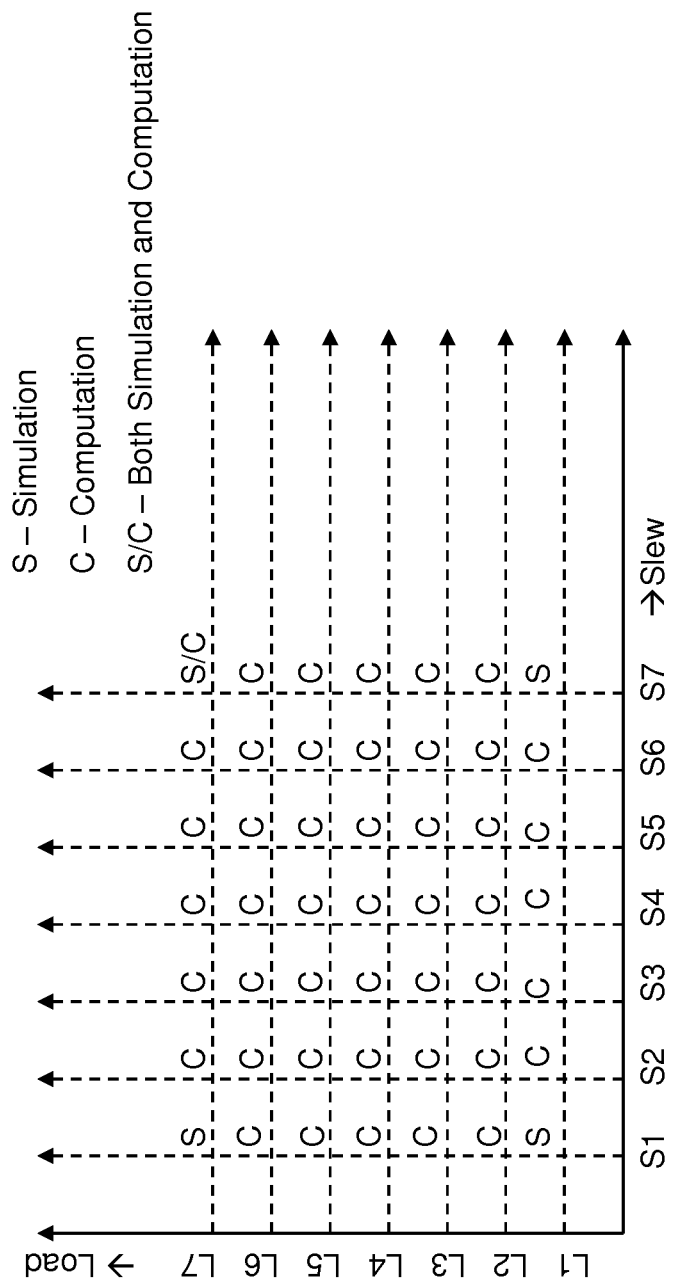
FIG. 4 is a matrix illustrating various embodiments herein.
Figure 5:
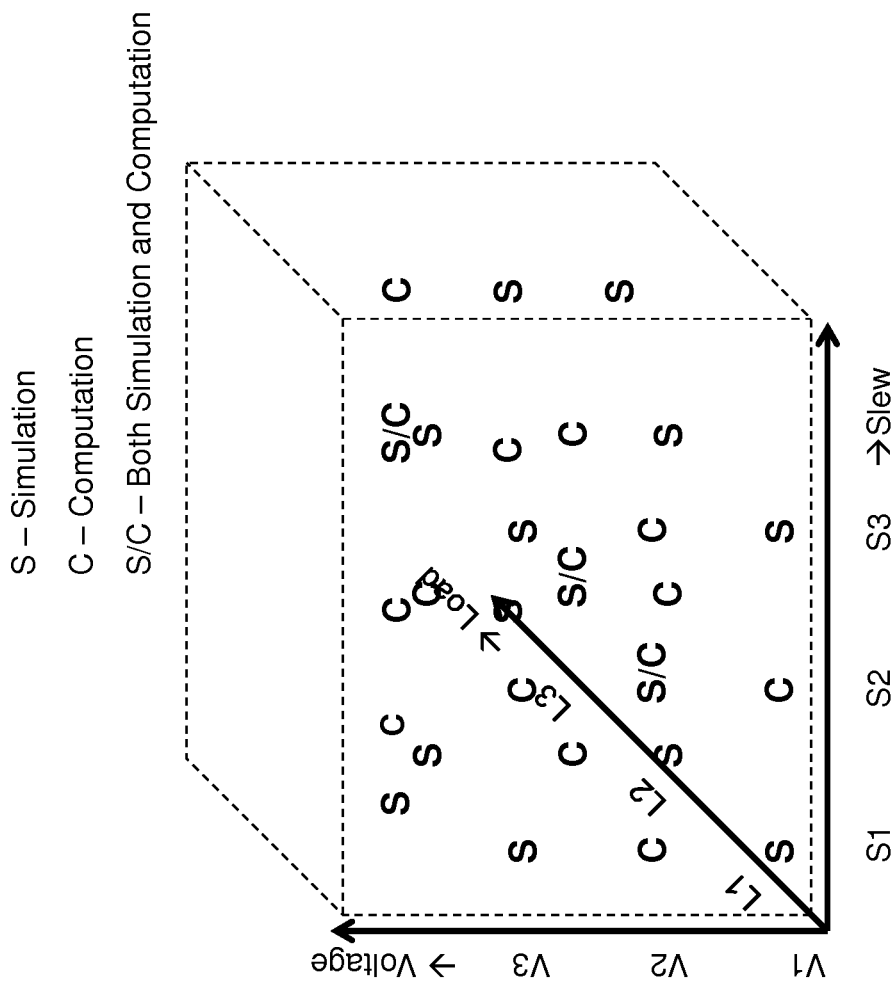
FIG. 5 is a matrix illustrating various embodiments herein.

While FIGS. 2-3 perform simulations for all values along two sides of the matrix (the "first side" and the "second side" mentioned above); such is not a requirement of the systems and methods herein. For example, simulations could be performed only on the four corners of the matrix, as shown in FIG. 4. Alternatively, one or more combined simulation/calculation could be performed at limited nodes along each of the sides of the matrix. Therefore, FIG. 4 illustrates simulations ("S") being performed at the first three corners, with one combination simulation/calculation ("S/C") being performed at the fourth corner (and all remaining values being calculated (interpolated)) as represented by "C". Further, while the combination simulation/calculation ("S/C") is performed at the fourth corner in the drawings, it could be performed at any locations in the matrix, as desired for accuracy.

Variables such as load and slew are used in the examples shown in FIGS. 1-4; however, those ordinarily skilled in the art would understand that the methods and systems herein are equally applicable to other commonly simulated variables including process, voltage, temperature, etc., and any such variables could be substituted for load and/or slew in the previous examples. Further, while FIGS. 1-4 illustrate 2-dimensional matrices, the methods and systems herein are equally applicable to multidimensional matrices, such as the 3-dimensional matrix shown in FIG. 5. The three axes shown in FIG. 5 include load (L1, L2, L3); voltage (V1, V2, V3), and slew (S1, S2, S3). As further shown in FIG. 5, various points within the three dimensional matrix can be pure simulation ("S"); pure calculation ("C"); or both simulation and calculation ("S/C").

Thus, as shown above, this disclosure presents methods for providing a circuit characterization model that simulate the first column and row splines of the matrix representing parameters for the circuit to be characterized as well as the N and M corner for the matrix. Then, through a computation, these methods interpolate the other members of the matrix without additional simulation. These methods can also check to see if the other members of the matrix are within simulation requirements. If the other members are not within the requirements, the methods can perform additional simulations.

Such methodologies reduce the number of simulations per circuit, and because the interpolation process is substantially quicker and less resource intensive than simulation, this provides significant improvement to the characterization TAT (and this is much more useful for statistical characterization). Further, this allows negative slews to be identified upfront during circuit design to allow circuit designers to take action early on in the process. This produces savings on data volume because less simulations results in disk space savings. The embodiments herein can work on small paths, can work with memories, and can help to simulate path on chip level.

In addition, embodiments herein can make a choice to simulate the entire matrix if the combination of the time needed to perform the interpolation calculations added to the time needed to perform the limited simulations exceeds the time that would be required to simply simulate the entire matrix. Therefore, the embodiments herein can be limited to situations where the methods herein save time compared to conventional methods that just simulate the entire matrix.

Figure 6:
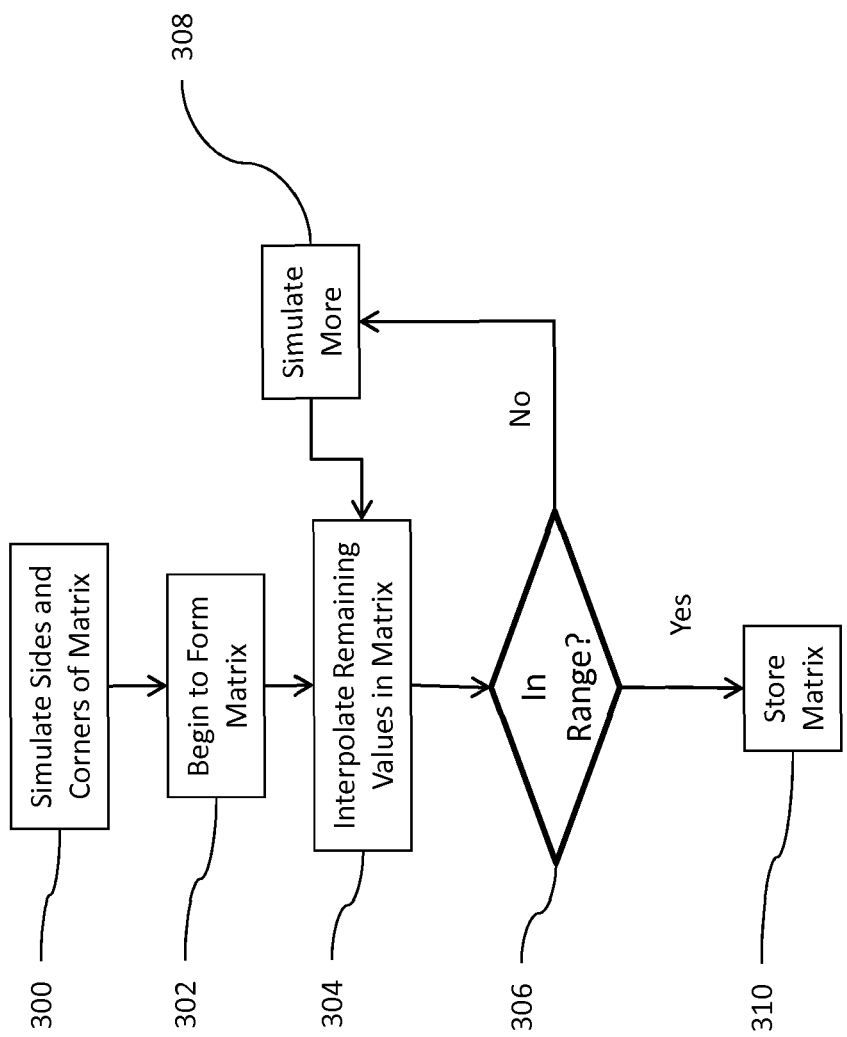
FIG. 6 is a flow diagram illustrating various embodiments herein.

The methods herein of performing a simulation on an integrated circuit design are shown in flowchart form in FIG. 6. In item 300, this exemplary method begins by simulating the sides and corners of the matrix.

More specifically, in item 300, these methods apply a first value to a first variable and a second value to a second variable of the simulation to produce a first matrix corner simulation value. The method repeats the simulation M times by keeping the first variable constant at the first value and by changing the second variable in each successive simulation. The Mth simulation produces a second matrix corner simulation value. The method also repeats the simulation N times by keeping the second variable constant at the second value and by changing the first variable in each successive simulation. The Nth simulation produces a third matrix corner simulation value. The method again repeats the simulation using a Nth value of the first variable and a Mth value of the second variable to produce a fourth matrix corner simulation value.

In item 302, the method then begins to create a matrix. The matrix has a first side running from the first matrix corner simulation value to the second matrix corner simulation value, a second side running from the first matrix corner simulation value to the third matrix corner simulation value, a third side running from the third matrix corner simulation value to the fourth matrix corner simulation value, and a fourth side running from the second matrix corner simulation value to the fourth matrix corner simulation value.

The method then interpolates all remaining values within the matrix based upon existing simulation values within the matrix in item 304 without performing additional simulation. Specifically, the interpolating process in item 304 comprises interpolating third side matrix values along the third side of the matrix by interpolating between the second matrix corner simulation value and the fourth matrix corner simulation value. Further, the interpolating process interpolates fourth side matrix values along the fourth side of the matrix by interpolating between the second matrix corner simulation value and the fourth matrix corner simulation value. The interpolating process can interpolate interior matrix values along columns between the second side and the fourth side by interpolating between corresponding ones of the second side matrix values and the fourth side matrix values. In addition, the interpolating process can also interpolate duplicate values along rows between the first side and the third side by interpolating between corresponding ones of the first side matrix values and the third side matrix values. Then, in one example, the interpolating process can combine the interior matrix values and the duplicate values to produce the interpolated values (by averaging the interior matrix values and the duplicate values, etc.). Additionally, the method can store the matrix in a design library to allow the matrix to providing a model of circuit behaviour for the integrated circuit design.

Further, the method can determine if the interpolated values are within a predetermined range in item 306. If the values produced by the simulation and calculation at the same node are not within an acceptable percentage of each other, the method repeats the simulation for selected interior matrix values in item 308 (less than all interior matrix values) using values between the first value and the Nth value for the first variable and using values between the second value and the Mth value for the second variable until the interpolated values are within the predetermined range. The simulation for selected interior matrix values can, for example, only produce additional simulation values along a diagonal line between the first matrix corner simulation value and the fourth matrix corner simulation value. Then, the calculated values ("C") of the matrix are interpolated again (using the new simulation values) and the values produced by the simulation and calculation at the same node are checked again to see if they are now within an acceptable percentage of each other. Thus, more and more nodes are simulated and the above processes are repeated until the values produced by the simulation and calculation at the same node are within an acceptable percentage of each other.

Once the values produced by the simulation and calculation at the same node are within an acceptable percentage of each other (item 306) the methods can store the matrix in a design library in item 310 to allow the matrix to providing a model of circuit behaviour for the integrated circuit design.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java®, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or 2-D block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
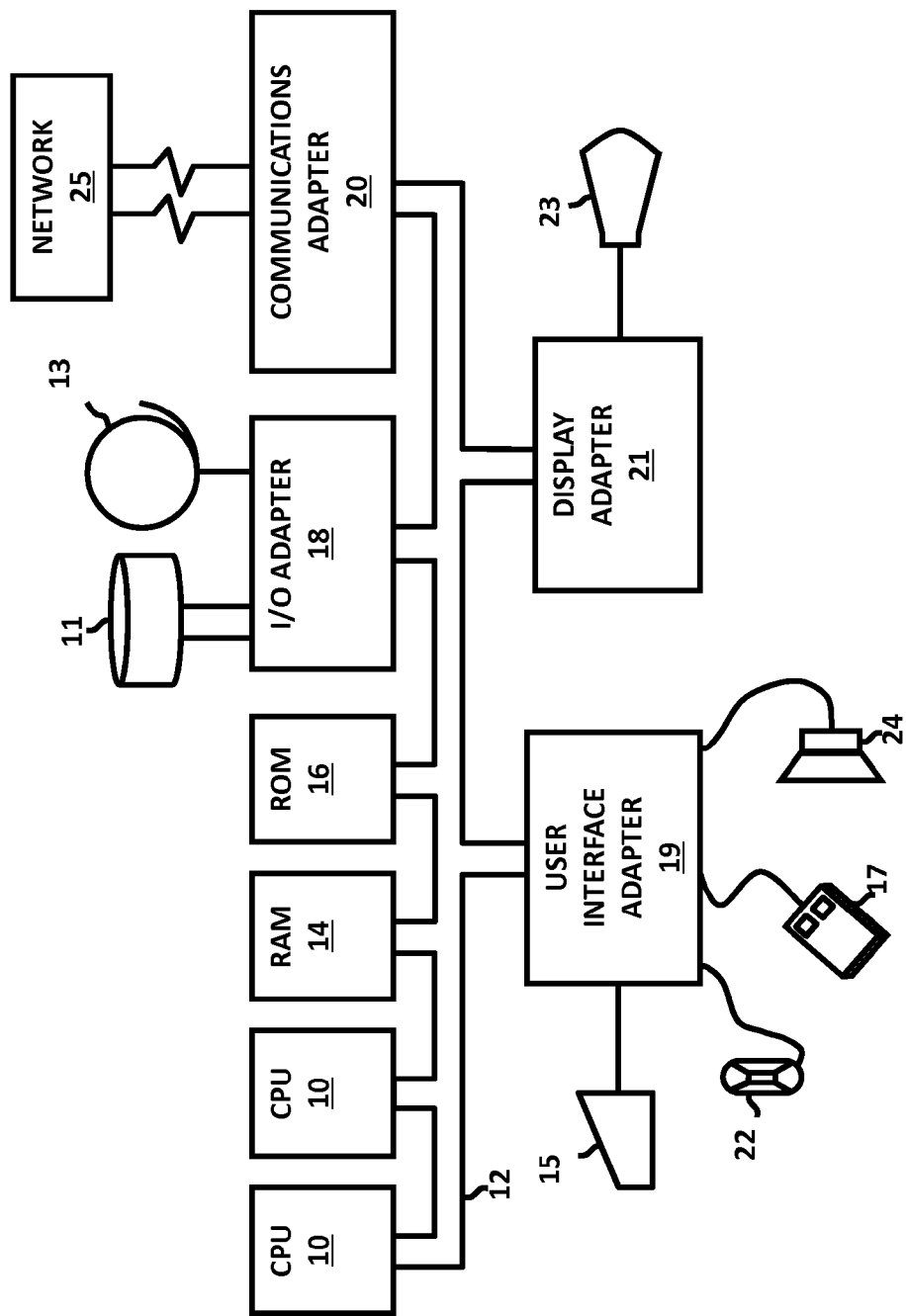
FIG. 7 is a schematic diagram of a hardware system according to embodiments herein.

A representative hardware environment for practicing the embodiments herein is depicted in FIG. 7. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server and proxy computers via loading a storage medium such as a CD, digital versatile disc (DVD), etc. The process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Next, the process software is sent directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 8:
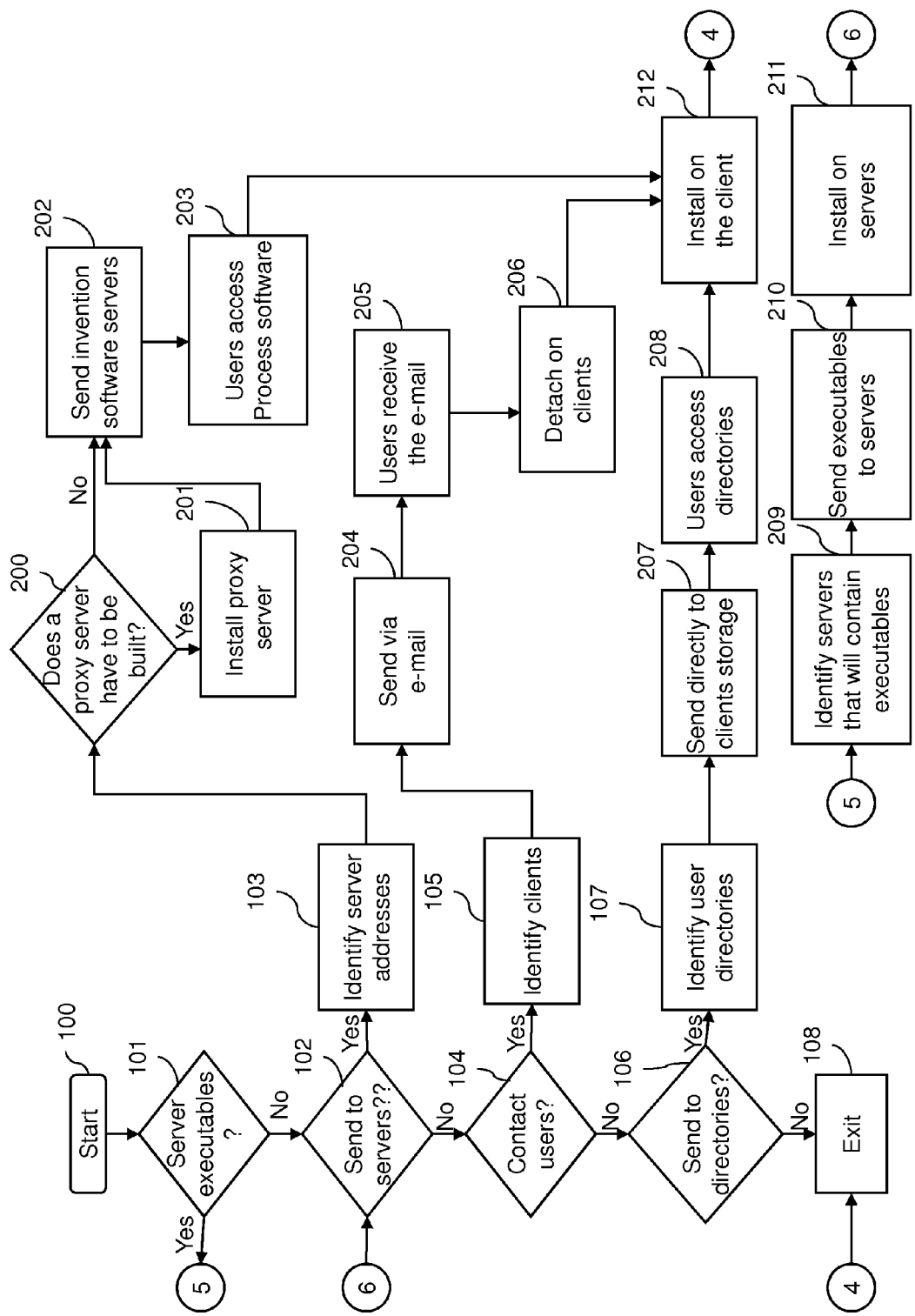
FIG. 8 is a flow of a deployment system according to embodiments herein.

As shown in FIG. 8, step 100 begins the deployment of the process software. The first thing is to determine if there are any programs that will reside on a server or servers when the process software is executed 101. If this is the case, then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers. The users then receive the e-mail 205 and then detach the process software from the e-mail to a directory on their client computers 206. The user executes the program that installs the process software on his client computer 212 then exits the process 108.

Lastly, a determination is made on whether the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 9:
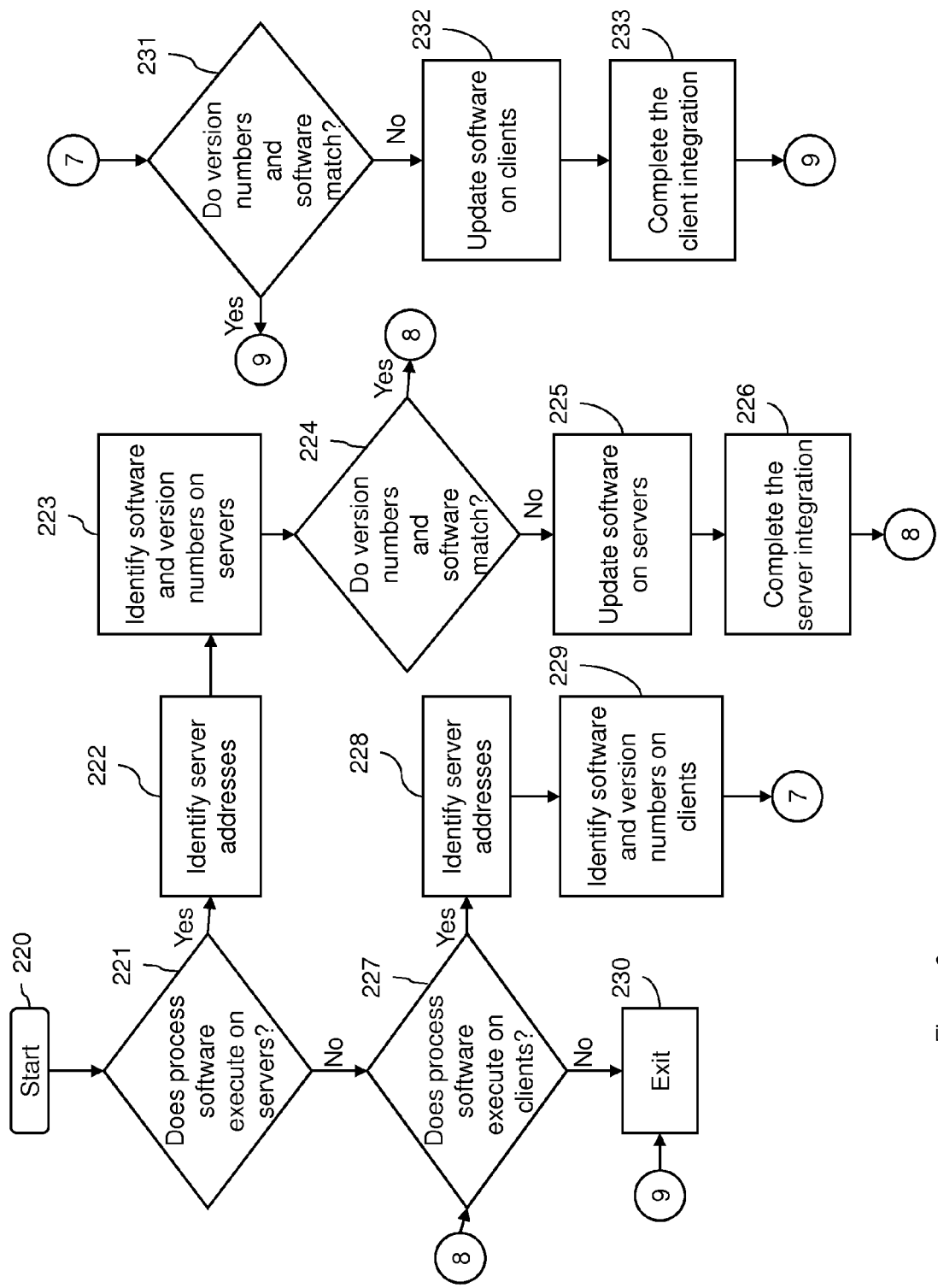
FIG. 9 is a flow diagram of an integration system according to embodiments herein.

As shown in FIG. 9, step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227. If one or more of the version numbers do not match, then the unmatched versions are updated on the server or servers with the correct versions 225. Additionally if there is missing required software, then it is updated on the server or servers 225. The server integration is completed by installing the process software 226. Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229. A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise, when other measurements of use such as network bandwidth, memory usage, storage usage, etc. approach a capacity so as to effect performance, additional network bandwidth, memory usage, storage etc. are added to share the workload.

The measurements used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay-as-you-go model.

Figure 10:
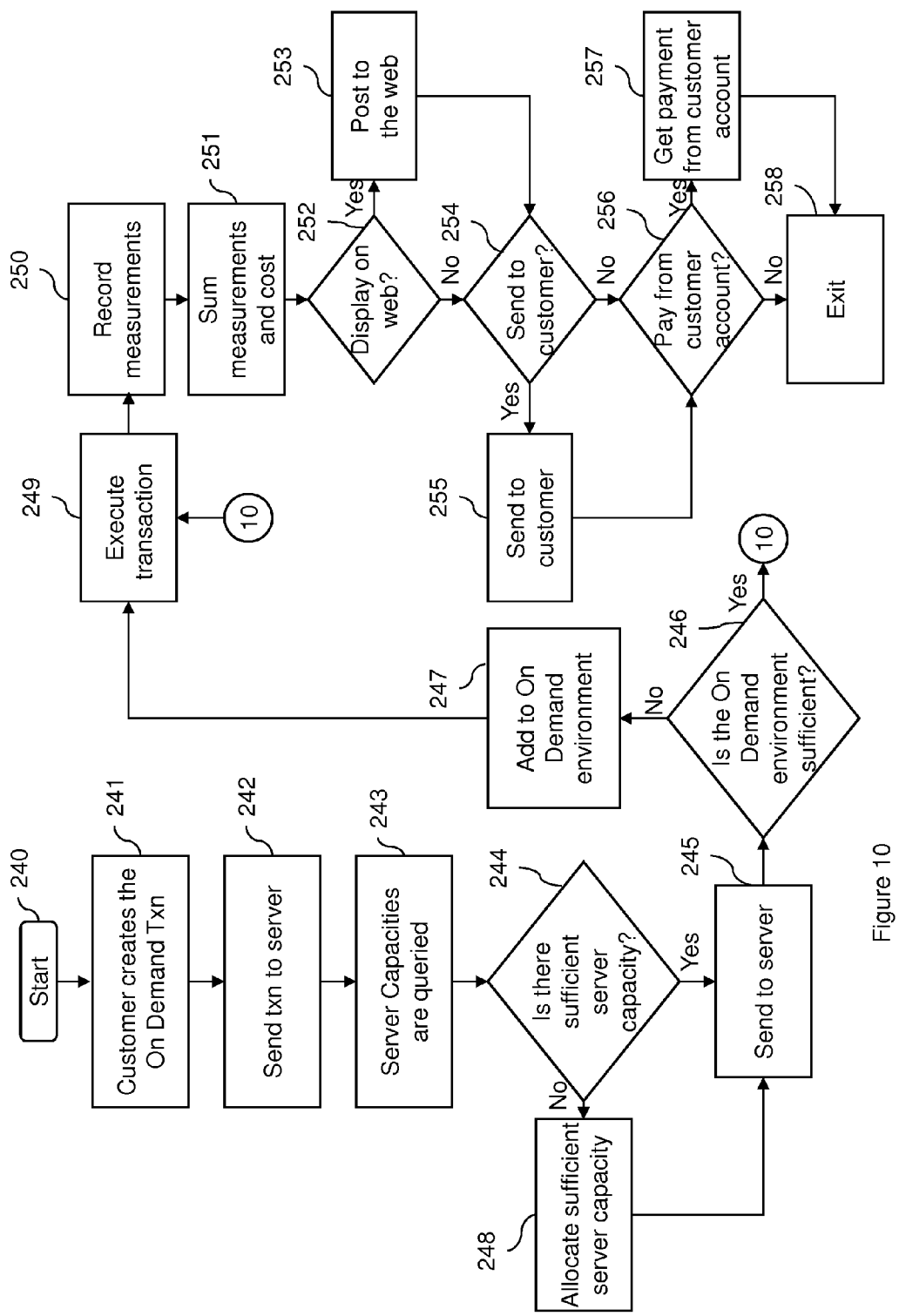
FIG. 10 is a flow diagram of an on demand system according to embodiments herein.

As shown in FIG. 10, step 240 begins the On Demand process. A transaction is created that contains the unique customer identification, the requested service type and any service parameters that further specify the type of service 241. The transaction is then sent to the main server 242. In an On Demand environment the main server can initially be the only server, then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things but is not limited to network bandwidth, processor memory, storage etc. 246. If there is not sufficient available capacity, then capacity will be added to the On Demand environment 247. Next, the required software to process the transaction is accessed, loaded into memory, then the transaction is executed 249.

The usage measurements are recorded 250. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process 258.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or digital subscriber line (DSL) modem to reach the NAS and use their VPN client software to access the corporate network and to access, download and execute the process software.

When using the site-to-site VPN, the process software is deployed, accessed and executed through the use of dedicated equipment and large-scale encryption that are used to connect a company's multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 11:
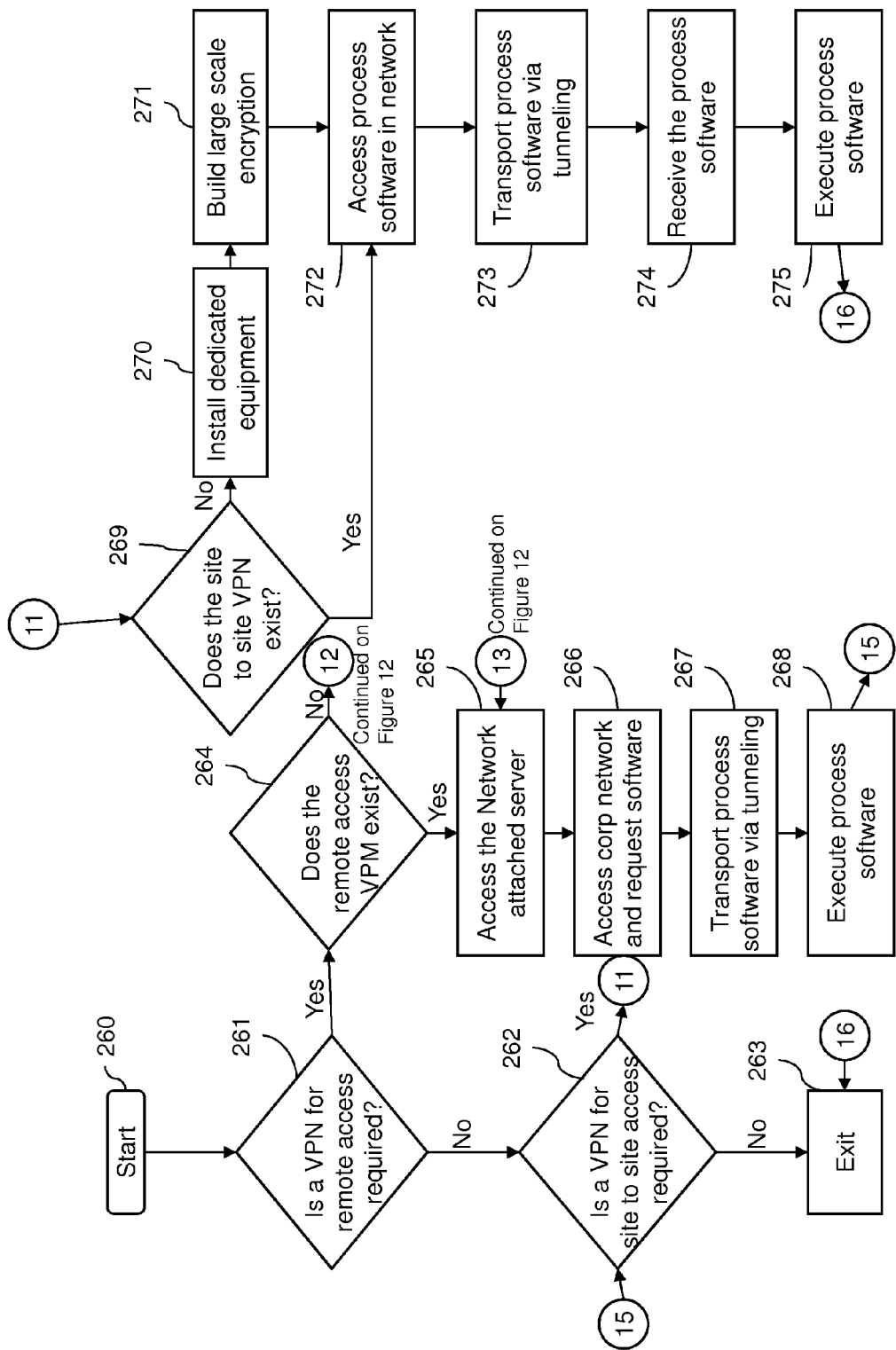
FIG. 11 is a flow diagram of a virtual private network system according to embodiments herein.
Figure 12:
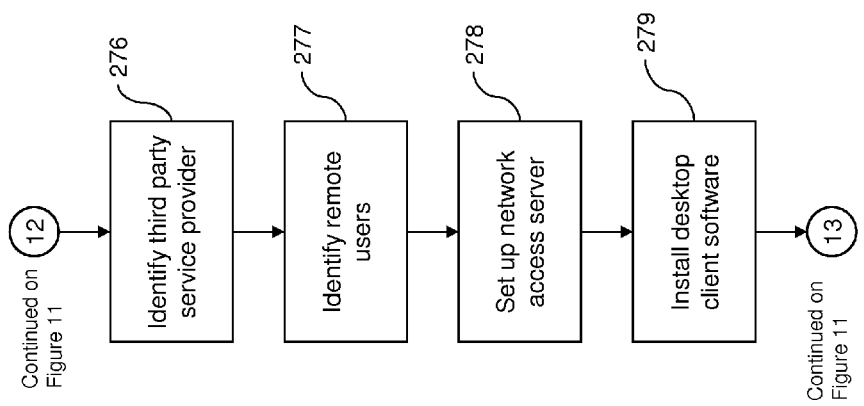
FIG. 12 is a flow diagram of a virtual private network system according to embodiments herein.

As shown in FIGS. 11-12, step 260 begins the Virtual Private Network (VPN) process. A determination is made to see if a VPN for remote access is required 261. If it is not required, then proceed to 262. If it is required, then determine if the remote access VPN exists 264. If it does exist, then proceed to 265. Otherwise, identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is, the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling 273. That is, the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   performing a simulation on an integrated circuit design using a computerized simulator machine by applying a first value to a first variable and a second value to a second variable of said simulation to produce a first matrix corner simulation value;
   repeating said simulation using said computerized simulator machine and using different values for said first variable and said second variable to produce a second matrix corner simulation value, a third matrix corner simulation value, and a fourth matrix corner simulation value;
   creating a matrix using said computerized simulator machine, wherein said matrix has said first matrix corner simulation value, said second matrix corner simulation value, said third matrix corner simulation value, and said fourth matrix corner simulation value;
   producing simulation values of only all interior nodes of said matrix that lie along any part of a diagonal line between said first matrix corner simulation value and said fourth matrix corner simulation value; and
   interpolating all remaining values within said matrix based upon existing simulation values within said matrix using said computerized simulator machine.

2. The method according to claim 1, said interpolating comprising:
   interpolating first side matrix values by interpolating between said first matrix corner simulation value and said second matrix corner simulation value;
   interpolating second side matrix values by interpolating between said first matrix corner simulation value and said third matrix corner simulation value;
   interpolating third side matrix values by interpolating between said third matrix corner simulation value and said fourth matrix corner simulation value;
   interpolating fourth side matrix values by interpolating between said second matrix corner simulation value and said fourth matrix corner simulation value; and
   interpolating interior matrix values along columns between said second side and said fourth side by interpolating between corresponding ones of said second side matrix values and said fourth side matrix values.

3. The method according to claim 1, said interpolating further comprising:
   producing both simulation and interpolation values of at least one node within said matrix; and
   comparing said simulation and interpolation values of said at least one node within said matrix to determine if said simulation and interpolation values of said at least one node are within a predetermined percentage of each other.

4. The method according to claim 3, wherein if said simulation and interpolation values of said at least one node are not within said predetermined percentage of each other, performing additional simulation on nodes of said matrix that were previously interpolated, and repeating said comparing until said simulation and interpolation values of said at least one node are within said predetermined percentage of each other.

5. The method according to claim 1, said using different values for said first variable comprising increasing said first variable in first equal increments, and said using different values for said second variable comprising increasing said second variable in second equal increments.

6. The method according to claim 1, further comprising storing said matrix in a design library.

7. The method according to claim 1, said computerized simulator machine comprising an application specific computerized device.

8. A method comprising:
   performing a simulation on an integrated circuit design using a computerized simulator machine by applying a first value to a first variable and a second value to a second variable of said simulation to produce a first matrix corner simulation value;
   repeating said simulation using said computerized simulator machine M times by keeping said first variable constant at said first value and by changing said second variable in each successive simulation of said M repeated simulations, wherein a Mth simulation produces a second matrix corner simulation value;
   repeating said simulation using said computerized simulator machine N times by keeping said second variable constant at said second value and by changing said first variable in each successive simulation of said N repeated simulations, wherein a Nth simulation produces a third matrix corner simulation value;
   repeating said simulation using said computerized simulator machine using a Nth value of said first variable and a Mth value of said second variable to produce a fourth matrix corner simulation value;
   producing simulation values of only all interior nodes of said matrix that lie along any part of a diagonal line between said first matrix corner simulation value and said fourth matrix corner simulation value; and
   creating a matrix using said computerized simulator machine, wherein said matrix has:
      a first side running from said first matrix corner simulation value to said second matrix corner simulation value;
      a second side running from said first matrix corner simulation value to said third matrix corner simulation value;

a third side running from said third matrix corner simulation value to said fourth matrix corner simulation value; and a fourth side running from said second matrix corner simulation value to said fourth matrix corner simulation value;

interpolating all remaining values within said matrix based upon existing simulation values within said matrix using said computerized simulator machine;

determining if interpolated values of said interpolating said all remaining values are within a predetermined range using said computerized simulator machine; and if said interpolated values are outside said predetermined range, repeating said simulation for selected interior matrix values using said computerized simulator machine using values between said first value and said Nth value for said first variable and using values between said second value and said Mth value for said second variable until said interpolated values are within said predetermined range.

9. The method according to claim 8, said interpolating comprising:

interpolating third side matrix values along said third side of said matrix by interpolating between said third matrix corner simulation value and said fourth matrix corner simulation value;

interpolating fourth side matrix values along said fourth side of said matrix by interpolating between said second matrix corner simulation value and said fourth matrix corner simulation value; and interpolating interior matrix values along columns between said second side and said fourth side by interpolating between corresponding values of said second side and said fourth side.

10. The method according to claim 8, said determining if said interpolated values are within said predetermined range comprising:

producing both simulation and interpolation values of at least one node within said matrix; and comparing said simulation and interpolation values of said at least one node within said matrix to determine if said simulation and interpolation values of said at least one node are within said predetermined percentage of each other.

11. The method according to claim 8, said changing of said first variable comprising increasing said first variable in first equal increments, and said changing of said second variable comprising increasing said second variable in second equal increments.

12. The method according to claim 8, further comprising storing said matrix in a design library.

13. The method according to claim 8, said computerized simulator machine comprising an application specific computerized device.

14. A non-transitory computer readable storage medium readable by a computerized device, said non-transitory computer readable storage medium storing instructions executable by said computerized device to perform a method comprising:

performing a simulation on an integrated circuit design by applying a first value to a first variable and a second value to a second variable of said simulation to produce a first matrix corner simulation value;

repeating said simulation using different values for said first variable and said second variable to produce a second matrix corner simulation value, a third matrix corner simulation value, and a fourth matrix corner simulation value;

creating a matrix, wherein said matrix has said first matrix corner simulation value, said second matrix corner simulation value, said third matrix corner simulation value, and said fourth matrix corner simulation value;

producing simulation values of only all interior nodes of said matrix that lie along any part of a diagonal line between said first matrix corner simulation value and said fourth matrix corner simulation value; and interpolating all remaining values within said matrix based upon existing simulation values within said matrix.

15. The non-transitory computer readable storage medium according to claim 14, said interpolating comprising:

interpolating first side matrix values by interpolating between said first matrix corner simulation value and said second matrix corner simulation value;

interpolating second side matrix values by interpolating between said first matrix corner simulation value and said third matrix corner simulation value;

interpolating third side matrix values by interpolating between said third matrix corner simulation value and said fourth matrix corner simulation value;

interpolating fourth side matrix values by interpolating between said second matrix corner simulation value and said fourth matrix corner simulation value; and interpolating interior matrix values along columns between said second side and said fourth side by interpolating between corresponding ones of said second side matrix values and said fourth side matrix values.

16. The non-transitory computer readable storage medium according to claim 14, said interpolating further comprising:

producing both simulation and interpolation values of at least one node within said matrix; and comparing said simulation and interpolation values of said at least one node within said matrix to determine if said simulation and interpolation values of said at least one node are within a predetermined percentage of each other.

17. The non-transitory computer readable storage medium according to claim 16, wherein if said simulation and interpolation values of said at least one node are not within said predetermined percentage of each other, performing additional simulation on nodes of said matrix that were previously interpolated, and repeating said comparing until said simulation and interpolation values of said at least one node are within said predetermined percentage of each other.

18. The non-transitory computer readable storage medium according to claim 14, said using different values for said first variable comprising increasing said first variable in first equal increments, and said using different values for said second variable comprising increasing said second variable in second equal increments.

19. The non-transitory computer readable storage medium according to claim 14, said method further comprising storing said matrix in a design library.

* * * * *